(12) United States Patent
Gardner et al.

(10) Patent No.: US 6,453,447 B1
(45) Date of Patent: Sep. 17, 2002

(54) METHOD FOR FABRICATING INTEGRATED CIRCUITS

(75) Inventors: Harry N. Gardner; Debra S. Harris; Michael D. Lahey; Stacia L. Patton; Peter M. Pohlenz, all of Colorado Springs, CO (US)

(73) Assignee: Aeroflex UTMC Microelectronic Systems Inc., Colorado Springs, CO (US)

( * ) Notice: Subject to any disclaimer, the term of this patent is extended or adjusted under 35 U.S.C. 154(b) by 0 days.

(21) Appl. No.: 09/640,344

(22) Filed: Aug. 16, 2000

Related U.S. Application Data
(60) Provisional application No. 60/149,832, filed on Aug. 19, 1999.

(51) Int. Cl.[7] .............................................. G06F 17/50
(52) U.S. Cl. ................... 716/3; 715/2; 715/17
(58) Field of Search ....................... 716/1–21

(56) References Cited

U.S. PATENT DOCUMENTS

| | | | |
|---|---|---|---|
| 4,584,653 A | 4/1986 | Chih et al. ................. 716/17 |
| 4,602,270 A | 7/1986 | Finegold et al. ........... 257/369 |
| 5,018,074 A | 5/1991 | Griffith et al. ............. 716/19 |
| 5,039,876 A | 8/1991 | Hochwald et al. .......... 327/225 |
| 5,140,402 A | 8/1992 | Murakata .................... 257/499 |
| 5,416,722 A | 5/1995 | Edwards ..................... 716/2 |
| 5,452,227 A | 9/1995 | Kelsey et al. ............... 716/3 |
| 5,459,673 A | 10/1995 | Carmeau et al. ............. 716/6 |
| 5,526,278 A | 6/1996 | Powell ....................... 716/16 |
| 5,543,736 A | 8/1996 | Gardner et al. ............. 326/101 |
| 5,553,274 A | 9/1996 | Liebmann .................... 716/21 |
| 5,563,801 A | 10/1996 | Lee et al. ................... 716/16 |
| 5,610,831 A | 3/1997 | Matsumoto ................... 716/19 |
| 5,666,288 A | 9/1997 | Jones et al. ................. 716/17 |
| 5,754,826 A | 5/1998 | Gamal et al. ................ 703/14 |
| 5,815,405 A | 9/1998 | Baxter ....................... 716/3 |
| 5,867,395 A | 2/1999 | Watkins et al. ............. 716/18 |
| 5,898,194 A | 4/1999 | Gheewala .................... 257/206 |
| 5,936,868 A | 8/1999 | Hall .......................... 716/4 |
| 6,189,131 B1 * | 2/2001 | Graef et al. ................ 716/8 |
| 6,189,132 B1 * | 2/2001 | Heng et al. ................. 716/11 |

OTHER PUBLICATIONS

Apanovich, Z.V. et al. Decomp: A Technology Migration Subsystem For Full Chip Mask Layouts IEEE Pacific Rim Conference on Communications, Computers and Signal Processing. Jan. 1997. vol. 2 pp. 942–945, especially abstract.

Trimberger, "Electronics In Cameras", IEEE Spectrum, Jun. 1982, pp. 38–45.

* cited by examiner

*Primary Examiner*—Matthew Smith
*Assistant Examiner*—Phallaka Kik
(74) *Attorney, Agent, or Firm*—Morgan & Finnegan, LLP

(57) ABSTRACT

Functional and geometrical sub-components of logic circuits are defined and used in the design of integrated circuits to facilitate the transformation of an integrated circuit design for fabrication at foundries with different design rules.

28 Claims, 15 Drawing Sheets

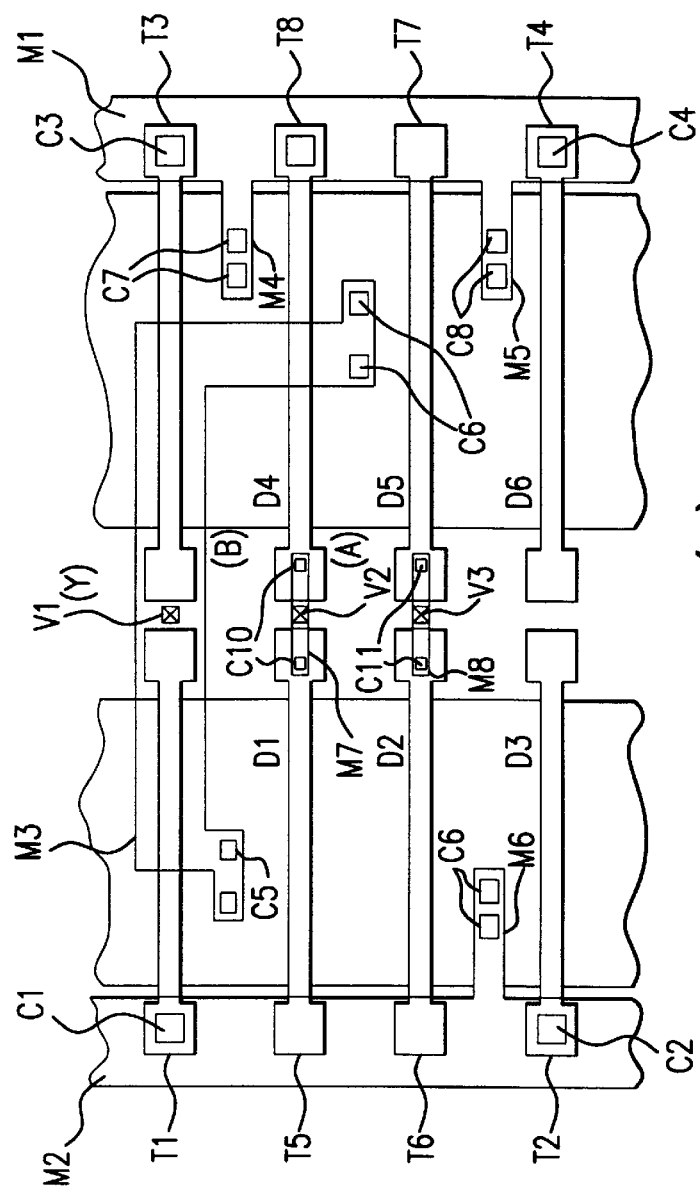
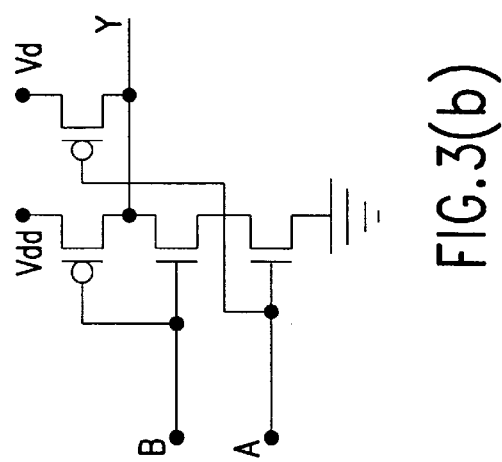
FIG.3(a)
FIG.3(b)

METHOD FOR FABRICATING INTEGRATED CIRCUITS

This application claims the benefit of U.S. provisional patent application No. 60/149,832, filed on Aug. 19, 1999, assigned to the assignee of the present invention and incorporated by reference, herein.

FIELD OF THE INVENTION

Integrated circuit design, and, more particularly, a simplified method of designing integrated circuits based on sub-components of cells and facilitating the transformation of the design between different foundries.

BACKGROUND OF THE INVENTION

Modern electronic circuits and systems are build on the foundation of discrete semiconductor devices and integrated circuits. An integrated circuit consists of both active and passive elements formed on a silicon substrate. Metal layers are proved to interconnect the electrically isolated active and passive elements, defining particular logic and circuit functions.

A Metal Oxide Semiconductor ("MOS") integrated circuit is one of the most popular type of integrated circuits in digital applications, where only an on-off transistor response is required. A particularly useful unit cell for the integrated circuit is a Complementary MOS ("CMOS"), which uses both n-channel and p-channel MOS field effect transistors ("FET") on adjacent regions of the chip. CMOS is one of the most widely used unit cells for various integrated circuits. One of the advantages of using CMOS is that the standard dc power dissipation can be reduced to very small levels.

A gate array is an array of basic transistor cells, such as CMOS transistors, aligned regularly on a semiconductor substrate to form a generic layer. A first metal layer is added over the generic layer to provide interconnections between particular transistors to define particular logic gates. Two or more metal layers connect the logic gates to provide the circuit functions required by a customer. The metal layers are separated by insulating layers. The metal layers above the generic layer, are referred to as "personalization" layers.

Computer aided design ("CAD") systems are widely used in designing integrated circuits ("IC"), such as gate arrays, standard-cell based designs and other types of ICs. With the CAD system, a designer can access a library of pre-designed logical functional blocks, (referred to as "cells") of particular logic functions, such as NAND, NOR or AND logic circuits, to more rapidly develop a high level design. The cells may be laid out and connected by metal personalization layers to create an IC accomplishing the desired functions. Each cell of the cell library is usually treated as a discrete block and the minimum unit of IC design.

FIG. 1 illustrates the major process steps in designing an integrated circuit. First, a functional specification is created at step 110 which identifies the primary functions of the IC. A well known hardware description language ("HDL") of a CAD system is often used at step 115 to specify the primary functions. At step 120, the behavior of the primary functions of the IC are then verified using a simulator. At step 125, the detailed logic for the design is created using a CAD program that synthesizes the logic from the HDL description using a cell library 160. Any commercial compiler can be used in this step. In addition to using predefined cells, the designer may also use custom patterned blocks, which may be manually crafted by a mask designer. The IC design is then verified at the logic level at step 130, using the functions and the timing characteristics of each cell in the cell library, to determine whether the design is functionally correct. Any commercial logic simulation tool may be used in this step. After the logic simulation, the logic circuits are placed on a master array and the cell interconnections are physically routed at step 135. Electronic circuit design is converted into physical layout design in this step. This process is typically automated using a placement and routing tool such as GARDS™, available from Silicon Valley Research, Inc., Austin, Tex., or Gate Ensemble™ from Cadence Design Systems, Inc., San Jose, Calif. Another post-layout timing verification is typically performed after the lay out process has been completed at step 140. At step 145, the foundry or an external mask supplier then uses the generated pattern data to create wafer used in the manufacture of the ICs. Prototype ICs are fabricated and tested at step 150. The design is modified, if necessary, to meet the performance specifications at step 155.

The IC fabrication process at a given foundry may differ from that at other foundries. For example, a more advanced fabrication facility may fabricate an IC with interconnections having narrower line widths and smaller spaces between adjacent layers than a less advanced facility. Transistors fabricated with smaller geometries generally have faster switching speeds and lower power than transistors having wider line widths. Depending on the foundry's fabrication technologies and techniques, and the materials used, different physical geometric configuration constraints apply. These constraints are commonly referred to as "geometric design rules" or more simply, "design rules." Design rules include dimensional specifications for the layout of a design such as minimum spacing between transistors, minimum separation between conductors to prevent shorting, minimum metal width, contact size and spacing between the contacts and minimum transistor length and width. For the IC to be fabricated at a different foundry with different design rules, the IC must be redesigned. Since this transformation into different design rules is a non-uniform transformation, it is a time consuming process increasing fabrication costs. For example, to transform an IC design based on cells to a different foundry with different design rules, each of the cells in the cell library, which typically includes several hundred cells, needs to be individually redesigned in accordance with the new design rules. Despite this cost, redesign of the IC is often necessary since fabrication at multiple foundries may be required to meet demand. Use of multiple foundries also reduces the risk of a supply shortage due to manufacturing problems at a particular foundry. A foundry may close necessitating the transfer of production to another foundry, as well.

Attempts have been made to facilitate IC design transformation between foundries. For example, U.S. Pat. No. 5,754,826 describes a method for transforming a rudimentary or generic circuit into two or more equivalent circuits for fabrication at different foundries in accordance with the design rules of those foundries. According to the '826 patent, an IC is designed from a generic cell library. To customize an IC design to a specific foundry, a software program converts the plurality of generic cells into a plurality of cells adapted for the design rules for that specific foundry. A large number of generic cells are required.

U.S. Pat. No. 5,563,801 discloses a method for compensating for the slight variations in performance of transistors fabricated in different foundries, by adjusting the gate widths of the transistors to compensate for the performance variations. This patent only addresses part of the difficulties associated with transformation of IC designs between foundries.

SUMMARY OF THE INVENTION

A cell for defining a logic function or logic circuit of an integrated circuit is a combination of several distinct functional and geometrical sub-components, many of which are applicable to many or all cells. In accordance with the present invention, the sub-components are separately designed in accordance with a set of design rules and stored in a library in the memory of a computer, for use in designing an IC through a CAD system. The sub-components are referred to as "primitive cells". A designer may use these primitive cells to design most of the logic functions, such as the INV, NOR, NAND logic circuits used in the design of an IC. An IC may now be viewed as a combination of a relatively small number of primitive cells, as compared to the several hundred cells in a cell library, facilitating the design of the IC and the transformation of the IC design for fabrication at another foundry in accordance with a different set of design rules.

To transform the IC design in accordance with the present invention, a corresponding library of primitive cells is designed in accordance with the design rules of the other foundry and the original primitive cells are replaced by the corresponding set of primitive cells in the IC design. Preferably, the outer length and width of each corresponding primitive cell are the same, even if the internal configuration of the corresponding primitive cells (i.e., size and number of contacts within the cells) differ. To maintain the same length and width, the outer dimension of the primitive cells are designed to meet the largest dimensional requirements of the design rules of the foundries where the IC may be fabricated. In addition, corresponding primitive cells are identified by the same name in each of the primitive cell libraries. Transformation may be readily accomplished through software by referencing the primitive cells in the primitive cell library to logic circuit cells containing those primitive cells in the logic circuit cell library used in designing the IC, such that changes in the configuration of the primitive cells automatically change the configuration of the logic circuit cells in the IC. Each type of primitive cell in the IC may individually be located and replaced by a corresponding primitive cell meeting the design rules of the second foundry through the software, as well.

BRIEF DESCRIPTION OF THE DRAWINGS

FIG. 3a shows a layout of a two input NAND logic circuit, removed from the portion of the IC of FIG. 2;

FIG. 3b is a corresponding schematic diagram of the NAND gate of FIG. 3(a);

DETAILED DESCRIPTION OF THE INVENTION

The methods of the invention are described with respect to a CMOS gate array, but are equally applicable to other types of ICs.

Figure 1:
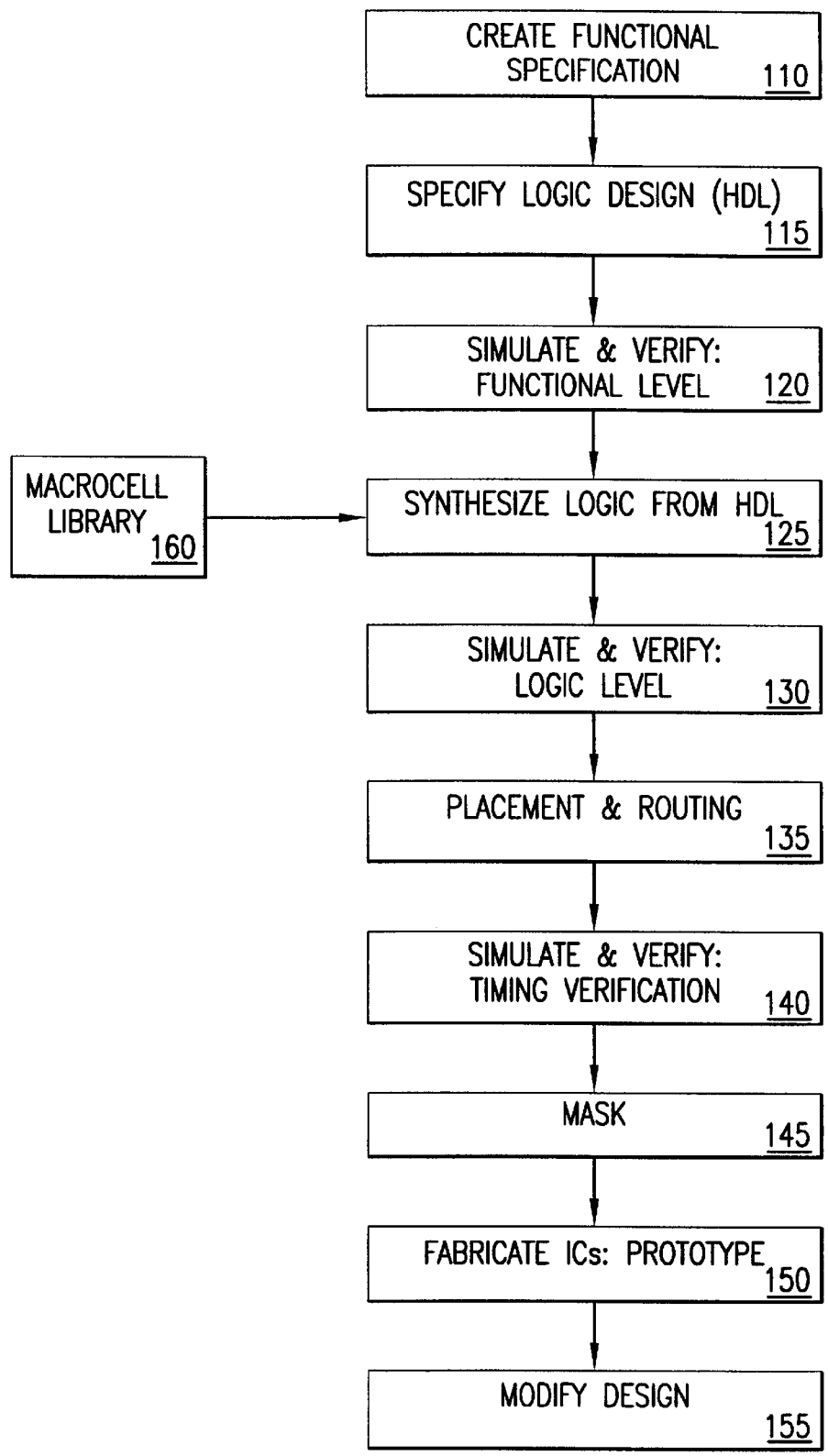
FIG. 1 illustrates the major process steps in designing an integrated circuit.
Figure 2:
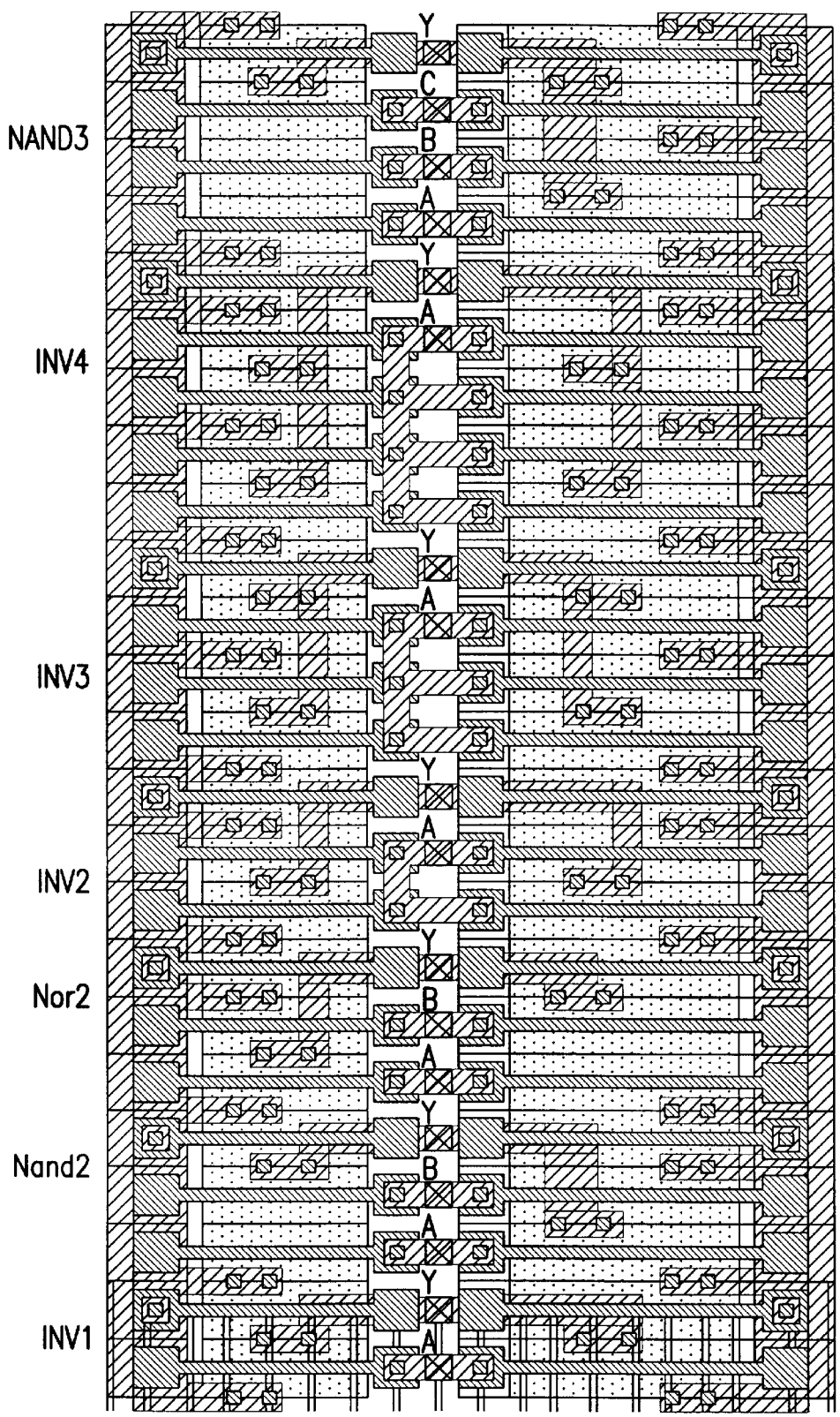
FIG. 2 shows a part of a CMOS gate array with a first metal layer connecting particular transistors to form particular logic circuits, as indicated.

FIG. 2 shows part of a CMOS gate array with a first metal layer connecting particular transistors to form particular logic gates. Seven stacked cells of logic circuits NAND2, NAND3, INV1, INV2, INV3, INV4 and NOR2 are shown. Each of the cells are electrically isolated by isolation transistors, as is known in the art. See, for example, U.S. Pat. No. 4,602,270, assigned to the assignee of the present invention and incorporated herein by reference. These cells will be interconnected by another metal layer (not shown) to form a completed IC with a specific function, according to a customer's requirement. The cells are carefully aligned to minimize the length of the metal connections between the cells.

Logic circuit cells, which are typically stored in a library and retrieved to assist in designing the IC, have been treated as the minimum unit of IC design. However, a cell is a combination of several distinct functional and geometrical sub-components, many of which are applicable to many or all of the cells. In accordance with the present invention, these sub-components are designed and stored in a library in the memory of a computer for use in designing an IC with a CAD system and for facilitating transformation of the IC design for fabrication at foundries with different design rules. The sub-components are referred to as "primitive cells". The primitive cells may be used to design most of the typical logic circuit cells, such as INV, NOR, NAND logic circuits, as described further, below. The IC design can now be viewed as combinations of different primitive cells.

FIG. 3a shows a layout of a two input NAND logic circuit, removed from the portion of the IC of FIG. 2. FIG. 3(b) is a corresponding schematic diagram of the NAND logic circuit of FIG. 3(a). Metal strips M1 and M2 are provided for power source $V_{dd}$ and ground $V_{ss}$, respectively. Four outer transistors T1, T2, T3, T4 are connected to the metal strips M1, M2 to disable the transistors, providing electrical isolation between the cells. For example, the gates of transistors T1, T2 are connected to the metal M2 through the contacts C1, C2 and the gates of transistors T3, T4 are connected to the metal M1 through the contacts C3, C4. Two n-channel transistors T5, T6 and two p-channel transistors T7, T8 are connected to form the two input NAND logic circuit. The drains D1, D5 of the transistors T5, T7 and T8 are connected to each other through the metal M3 and corresponding contacts C5, C6. This metal connection also serves as an output node Y of this logic gate through via V1, which connects one metal layer to another metal layer. The drain D3 of the transistor T6 is connected to the metal M2 through the metal M6 and the corresponding contacts C6. Each of the sources D4, D6 of the transistors T7, T8 are connected to the metal M1 through the metals M4, M5 and corresponding contacts C7, C8, respectively. The metal M7 connects the gate electrode of the transistor T5 to the gate electrode of the transistor T8. The metal M8 connects the gate electrode of the transistor T6 to the gate electrode of the transistor T7. The metals M7, M8 also serve as input nodes A, B of this logic gate through vias V2, V3. The p-channel transistors T7, T8 have wider gate widths and accordingly a larger active region than the n-channel transistors T5, T6, to compensate for the difference in carrier mobility between the two transistors type.

CMOS gate arrays can be viewed as a repeating pattern of horizontal pairs of CMOS transistors including active areas and horizontal pairs of gates. The outer end of the n-channel transistor overlaps a ground metal strip $V_{ss}$ and the outer end of the p-channel transistor overlaps a power source metal strip $V_{dd}$. It has been found useful in IC design and transformation between foundries in accordance with the present invention to define the generic layer of the gate array by a plurality of identical pairs of CMOS transistors, including active areas and gate electrodes, and the sections of metal which are part of the ground metal strip $V_{ss}$ and power source metal strip $V_{dd}$.

Figure 4A:
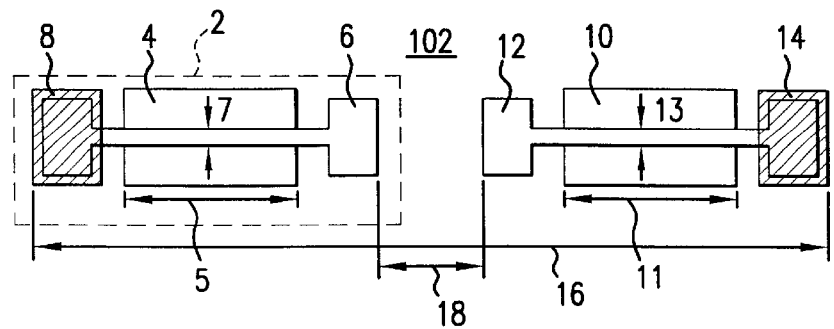
FIGS. 4a–4u show various primitive cells, in accordance with the present invention.

FIG. 4a shows such a pair of CMOS transistors, including a p-well region 2, active areas 4, 10, gate electrodes 6, 12, and sections of metals 8, 14, which define a primitive cell 102 of the generic layer of the gate array in accordance with the present invention. The primitive cell 102 is designed to conform to the design rules for a particular foundry, which determines the length 7, 13 and width 5, 11 of the gate electrodes 6, 12, respectively, the space 18 between the n and p-channel transistors and the gate length. The height 20 of the metals 8, 14 for defining the metal strips should be equal to the height of the active areas 4, 10 of the primitive cell 102, so that a vertically aligned series of the primitive cells 102 will define the gate array, including the continuous metal strips for the ground metal strip $V_{ss}$ and power source metal strip $V_{dd}$. The primitive cell 102 may also comprise two pairs of vertically aligned n and p-channel transistors.

Instead of including portions for defining the metal strips $V_{ss}$, $V_{dd}$ in the primitive cell 102, it may be useful to provide separate primitive cells for the power source metal $V_{dd}$ and ground metal $V_{ss}$. Primitive cell 104 in FIG. 4b may be used both for the ground metal strip $V_{ss}$ and power source metal $V_{dd}$.

To design the primitive cell 102, the outline of a first layer of the cell 102, which may be the p-well region 2, is drawn on the CAD screen and stored in the CAD system. Another layer of the cell, which may be the active areas 4, 10, is then drawn and stored. Another layer of the cell, which may comprise the gate electrodes 6, 12 is then drawn and stored. The lengths 7, 13 of the gates 6, 12 are determined based on the design rules of the foundry where the IC is to be fabricated. Another layer, which may be the metals 8, 14, is then drawn and stored. After completing the design of each of the separate layers, the four layers are retrieved, precisely aligned in an overlapping pattern, and stored in memory as the primitive cell 102. The dimensions of the p-well, active area and metals are based on simulations which may be performed with HSPICE$^R$, available from AVANT!, Sunnyvale, Calif., for example. The details of the operation of the CAD system in IC design is well known in the art.

Figure 4C:
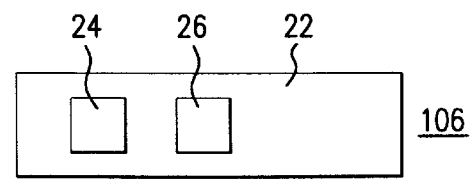
Figure 4B:
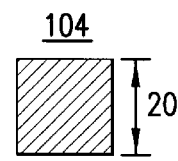
Figure 4D:
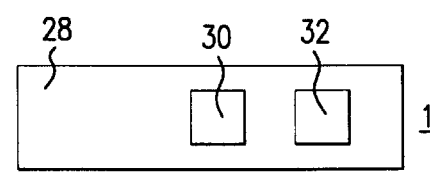
Figure 4E:
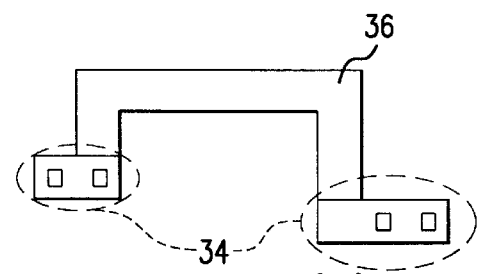
Figure 4F:
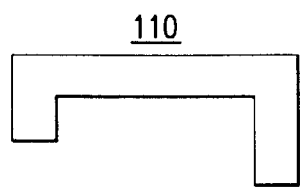
Figure 4H:
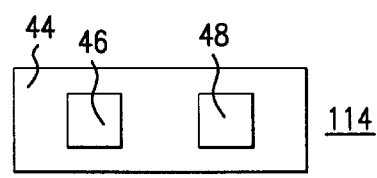

Between the cells on a gate array, it is also typically necessary to connect the gate electrodes of the isolation transistors with the power source metal strip $V_{dd}$ and the ground metal strip $V_{ss}$. In FIG. 3a, the gate electrodes of the isolation transistors T1–T4 are connected with the power source and ground metals M1, M2 through the contacts C1–C4. FIG. 4i shows a primitive cell 116 for defining such contacts. The primitive cell 116 connects the gate electrodes of the n and p-channel transistors to the ground metal $V_{ss}$ and to the power source metal $V_{dd}$, respectively, disabling the transistors for isolation of each of the logic gates. The size of the primitive cell 116 meets the design rules of the targeted foundry. The primitive cell for the contacts C1–C4 (FIG. 3a) may also comprise a contact, such the contact 116, and the. metal surround, forming primitive cell 138, as shown in FIG. 4t.

In most cells, it is necessary to provide a connection between the active areas of the p-channel transistors and the power source metal. In FIG. 3a, such connections are provided between the active areas D4, D6 and the power metal $V_{dd}$ by the metal strip M4 and corresponding contact C7, and by the metal strip M5 and corresponding contact C8. This connection may be provided by a separate rectangular metal strip and contacts. FIG. 4c is a primitive cell 106 for providing this function. The primitive cell 106 comprises a rectangular metal strip 22 and two contacts 24, 26. The length of the metal strip 22 is long enough for the contacts 24, 26 to overlap the power source metal $V_{dd}$.

To design the primitive cell 106, the contacts 24, 26 are drawn as a first layer and saved in the CAD system. The metal strip 22 is then drawn and saved in the CAD system. Both layers are retrieved, properly aligned to form the primitive cell 106, and saved. The dimensions of the contacts and the amount of metal surrounding the contacts is determined by the design rules of the targeted foundry. Alternatively, two primitive cells 116a of FIG. 4t may be retrieved from memory and aligned with a metal strip.

Similarly, a connection between the active areas of the n-channel transistors and the ground metal $V_{ss}$ is typically needed in most of the cells. In FIG. 3a, the active area D3 is connected to the ground metal $V_{ss}$ by the metal strip M6. FIG. 4d shows a primitive cell 108 comprising a rectangular metal strip 28 and two contacts 30, 32, for providing this function. As above, the length of the metal strip 28 of the primitive cell 108 is sufficient for the contacts 30, 32 to overlap the ground metal $V_{ss}$. Primitive cell 108 may also be constructed from primitive cell 116a, as described above with respect to primitive cell 106.

It is also necessary to connect the drains of the n and p-channel transistors in most cells. This is typically accomplished by crossing metal strips over the space between the horizontal pair of transistors, referred to as the routing channel. In FIG. 3a, for example, the metal M3 connects the drains D1, D5 of the transistors T5, T7 and T8 through the contacts C5, C6. FIG. 4e shows the metal M3 removed from the NAND logic circuit of FIG. 3a. The metal M3 can be divided into three sub-blocks comprising two identical regions 34 and a metal interconnecting region 36. It is noted that there must be sufficient overlap between the regions 34 and the metal interconnecting region 36, to ensure an adequate connection. FIG. 4f is a primitive cell 110 for providing such a metal interconnecting region.

Figure 4G:
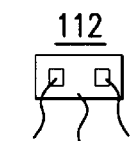
Figure 4I:
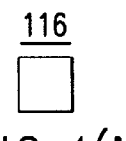

FIG. 4g shows a primitive cell 112 for providing a contact between the active areas D1, D5 and the metal interconnecting region 36. The primitive cell 112 is composed of metal strips 38 and contacts 40, 42. It is noted that the primitive cell 110 uniquely defines the two input NAND logic circuit. Other logic gates would require a metal interconnecting region having a different shape to connect the drains of different n and p channel transistors.

It is also typically necessary to connect the adjacent gate electrodes of the n and p-channel transistors in each pair of working transistors. In FIG. 3a, for example, the metals M7, M8 connect the gate electrodes of the n-channel transistors T5, T6 with the gate electrodes of the p-channel transistors T8, T7, respectively, through contacts C10, C11. FIG. 4h is a primitive cell 114 for providing this function, comprising a rectangular metal strip 44 including two contacts 46, 48. Since the primitive cell 114 crosses the routing channel region where routing metals are placed, the contacts 46, 48 are positioned at each end of the metal strip 810, leaving a space between them for connection of subsequent upper metal layers, such as vias.

Figure 4J:
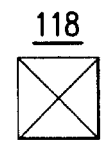
Figure 4T:
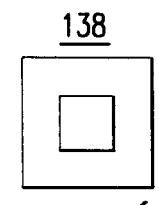
Figure 4U:
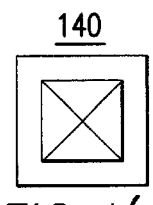

Personalization of a gate array also requires appropriate connection between the input and output nodes of the particular logic circuits though the upper metal layer. In FIG. 3a, vias V1, V2, V3 connect input A, B and output Y nodes with an upper metal layer (not shown). FIG. 4j shows a primitive cell 118 for defining such vias. The primitive cell for defining the vias can also include metal surround, as in primitive cell 140 FIG. 4u.

The primitive cells are stored in a primitive cell library in the memory of a computer for use during the design of an IC. The memory may be the hard-drive of a computer, a floppy disk, or a compact disk, or any other convenient memory device, for example.

The use of rectilinear primitive cells is preferred, to facilitate placement of the primitive cells on the grid of a CAD system during design of an IC, to facilitate conforming to the design rules of a particular foundry, and to reduce fracturing during manufacture of masks used to fabricate the IC. Non-orthogonal sides are preferably avoided.

IC's are typically designed by placement and connection of cells from a cell library on the grid of a CAD display, based on the logic design developed for the IC. As an example of designing an IC based on primitive cells according to the present invention, the design of the two input NAND logic circuit from the library of primitive cells described above, is described.

After deciding how many gates are required in the gate array, an appropriate primitive cell for defining the generic layer of a gate array, such as the primitive cell 102, is retrieved from the library of primitive cells and positioned on the grid. Then the primitive cell 102 is repeated (stepped) to form the gate array. The required number of primitive cells 102 is precisely aligned in the vertical direction to define the generic layer of the CMOS gate array, including the ground metal $V_{ss}$ and the source metal $V_{dd}$.

Then, a particular logic circuit is selected for implementation on the gate array based on a schematic diagram of the circuit. The connections required to provide a particular logic function on the gate array are usually known to the designer. For example, based on the schematic diagram of the two input NAND logic circuit shown in FIG. 3b, the designer knows that the two n-channel transistors are connected in series and one of these n-channel transistors is connected to ground metal $V_{ss}$. The designer also knows that the two p-channel transistors are connected in series and are also connected to the power source metal $V_{dd}$. It is also known that two additional n and p-channel transistors are needed at the boundaries of the logic gate for isolation.

Figure 5A:
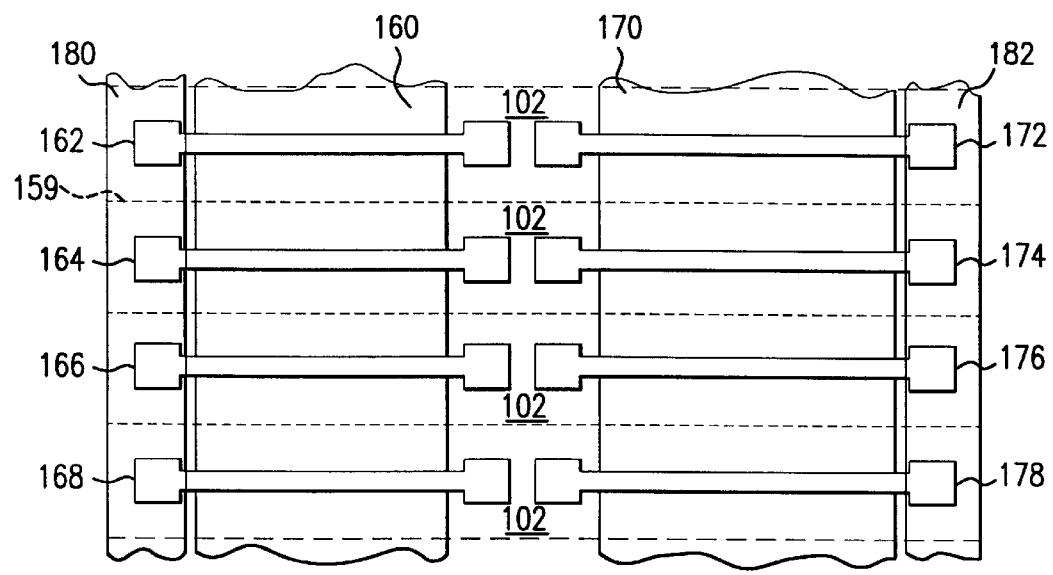
FIGS. 5a–5h show various steps in the design of a two input NAND logic circuit with primitive cells.

The four pairs of the transistors required to define the two input NAND logic circuit are selected by the designer on the gate array. FIG. 5a shows a selected portion of the gate array. Dotted lines 159 indicate the boundaries of the repeated primitive cells 102.

Figure 5B:
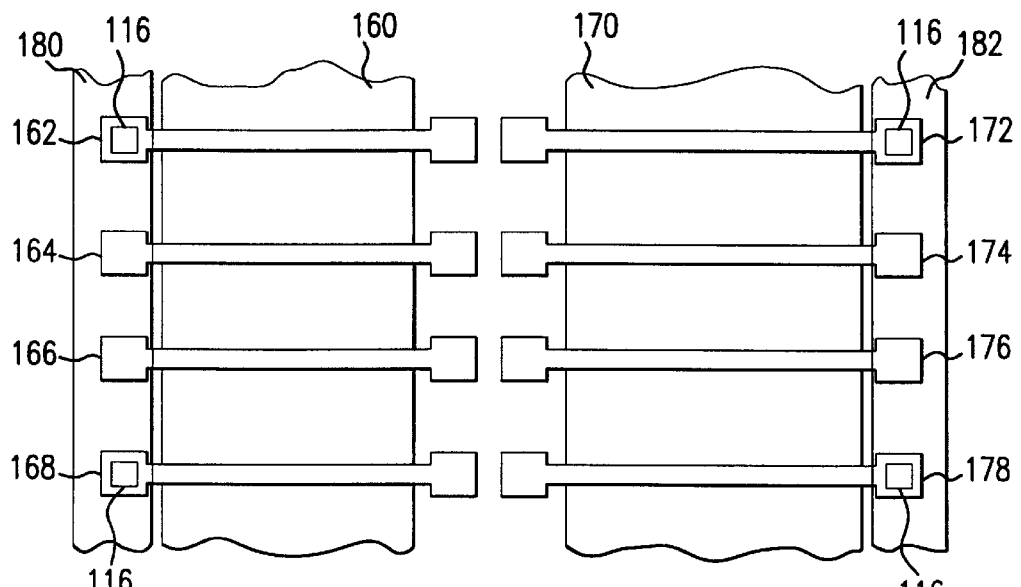

As a next step, isolation may be provided by connecting the gate electrodes 162, 168, 172, 178 of the four isolation transistors to the adjacent source metal strip $V_{ss}$ 180 or the adjacent ground metal strip $V_{dd}$ 182. The primitive cells 116 (FIG. 4i) for this purpose, discussed above, are retrieved from memory ("called up") and positioned on the outer ends ("heads") of each pair of gate electrodes 162, 168, 172, 178 of the isolation transistors through the use of a mouse or the keyboard of the computer. FIG. 5b is a view of the enlarged portion of the gate array, with four primitive cells 116 positioned to provide isolation.

Figure 5C:
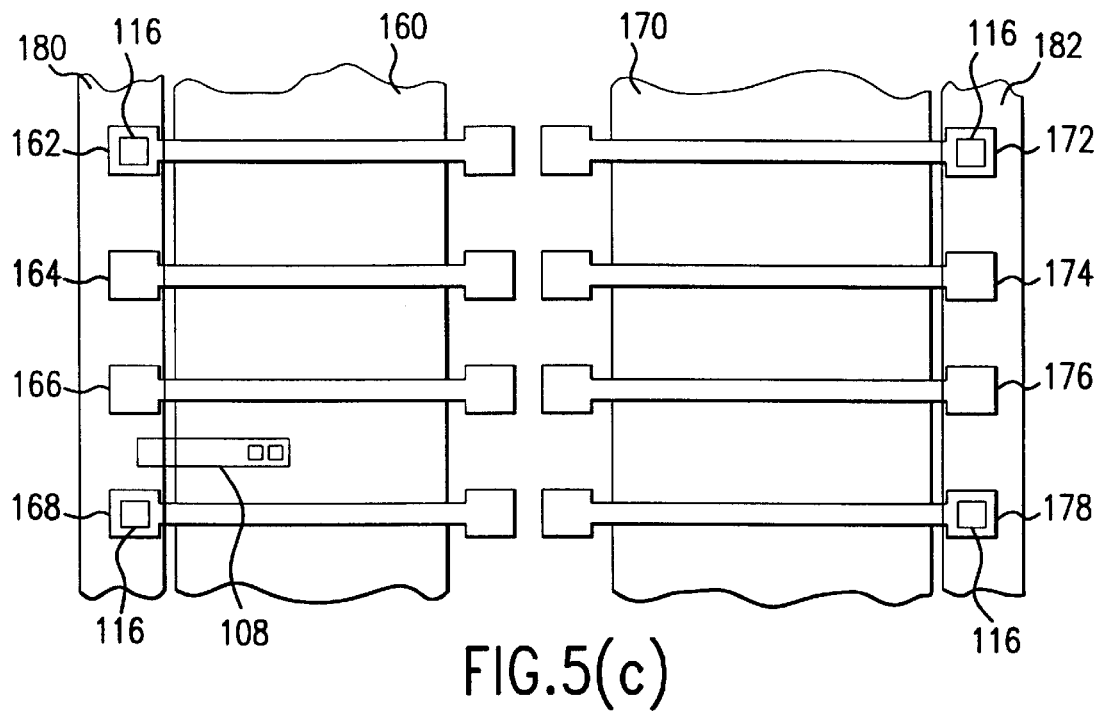

Then a primitive cell 108 (FIG. 4d) is retrieved and positioned to connect the appropriate active area between the gate electrodes 166, 168 of n-channel transistors to the ground metal $V_{ss}$ 180, as shown in FIG. 5c.

Figure 5D:
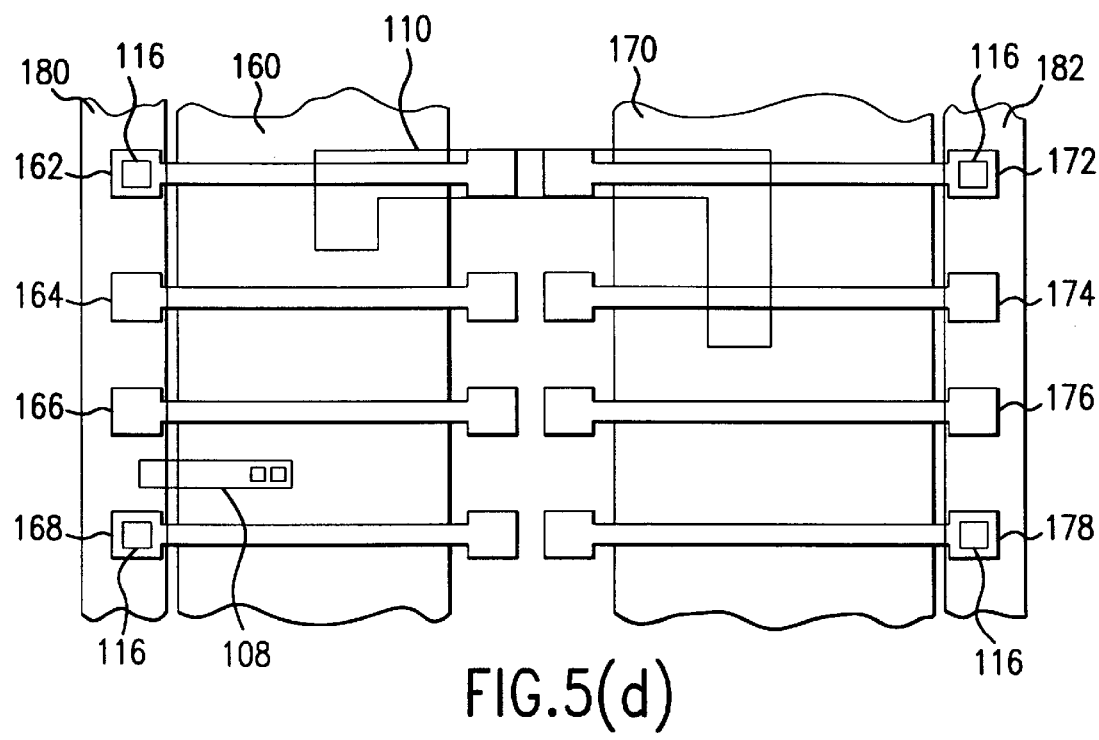

Next, the appropriate gates may be connected to define the logic function. The primitive cell 110 (FIG. 4f) for defining a two input NAND logic circuit is retrieved and positioned to connect the active area between the gate electrodes 162, 164 of the n-channel transistors and the active area between the gate electrodes 174, 176 of the two working p-channel transistors, as shown in FIG. 5d.

Figure 5E:
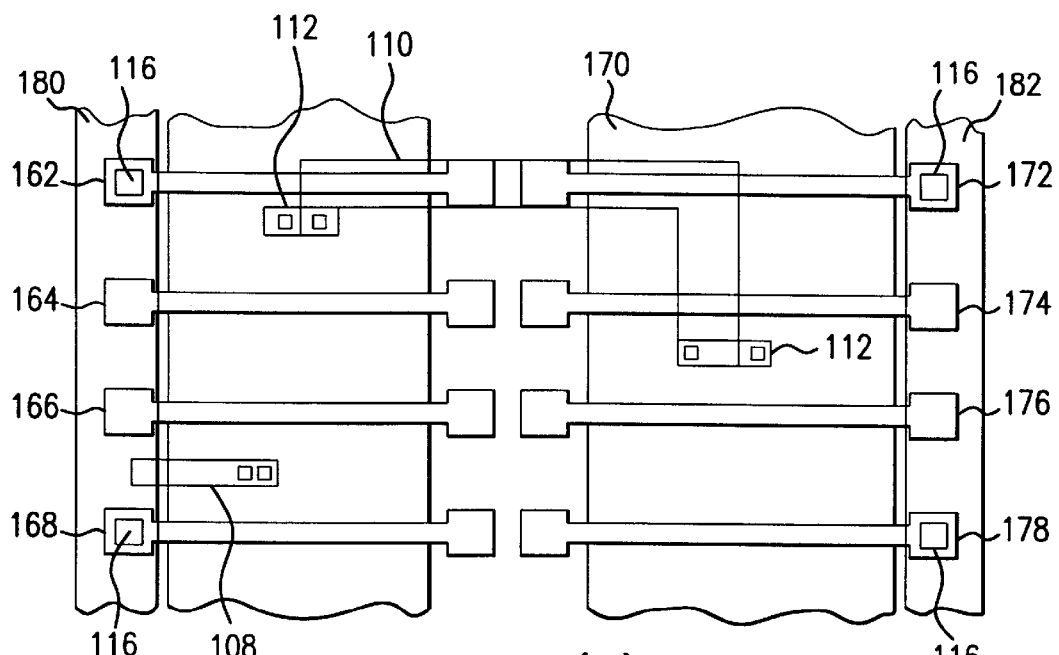

Next, the primitive cell 112 (FIG. 4g) may be retrieved and positioned on one end of the primitive cell 110, to form the actual contact between the primitive cell 110 and the corresponding active area between the gate electrodes 162, 164 of n-channel transistors, as shown in FIG. 5e. Another primitive cell 112 is retrieved from the primitive cell library and positioned on the other end of primitive cell 110 to form the actual contact between the primitive cell 110 and the other active area between the gate electrodes 174, 176. A sufficient portion of the cells 110, 112 must overlap to provide sufficient contact, as shown in FIG. 5e.

Figure 5F:
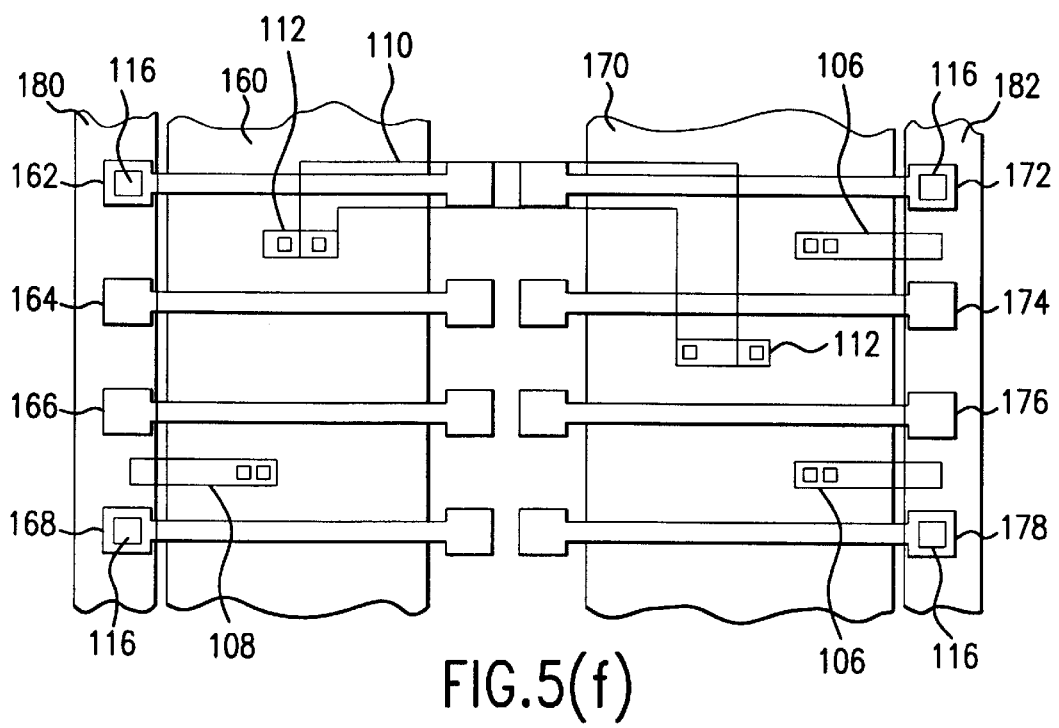

Primitive cell 106 (FIG. 4c) may then be retrieved and positioned between the gate electrodes 172, 174 of the p-channel transistors, as shown in FIG. 5f. The primitive cell 106 may be retrieved and positioned between the gate electrodes 176, 178 of the p-channel transistors.

Figure 5G:
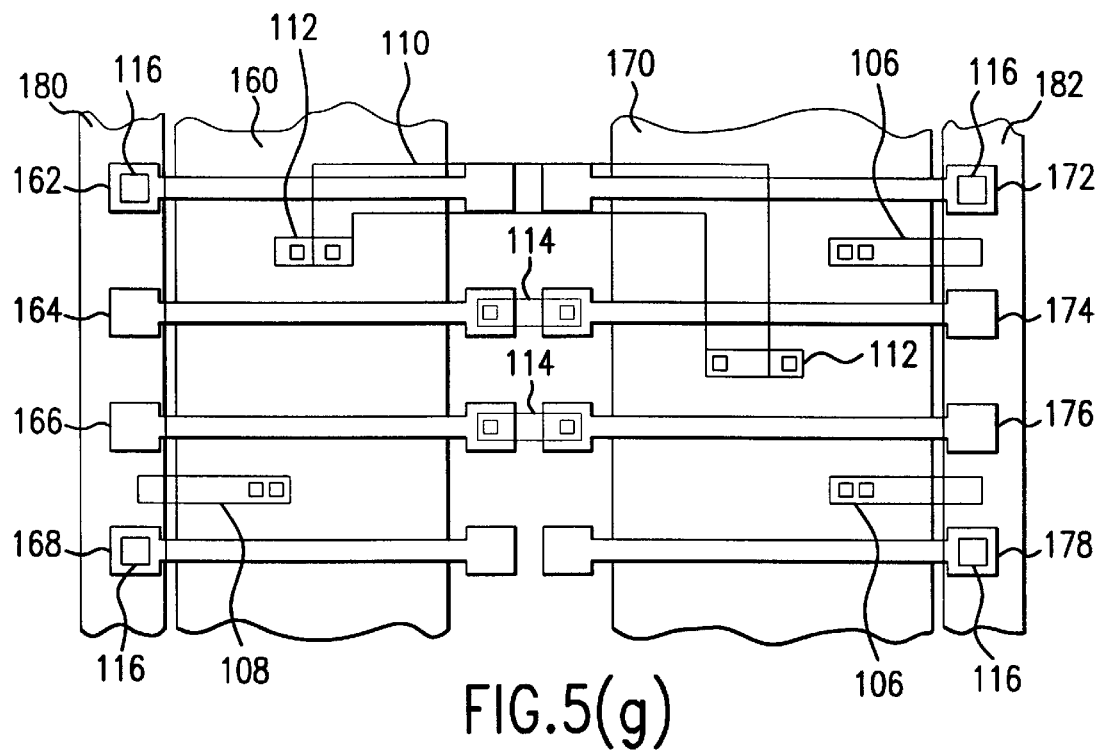

To connect the adjacent gate electrodes of each pair of working transistors, the primitive cell 114 (FIG. 4h) is retrieved and positioned over the gate electrodes 164, 174 of the upper working n and p-channel transistors. Additional primitive cells 114 are retrieved and similarly placed between the gate electrodes 166, 176 of the lower working n and p-channel transistors, as shown in FIG. 5g.

Figure 5H:
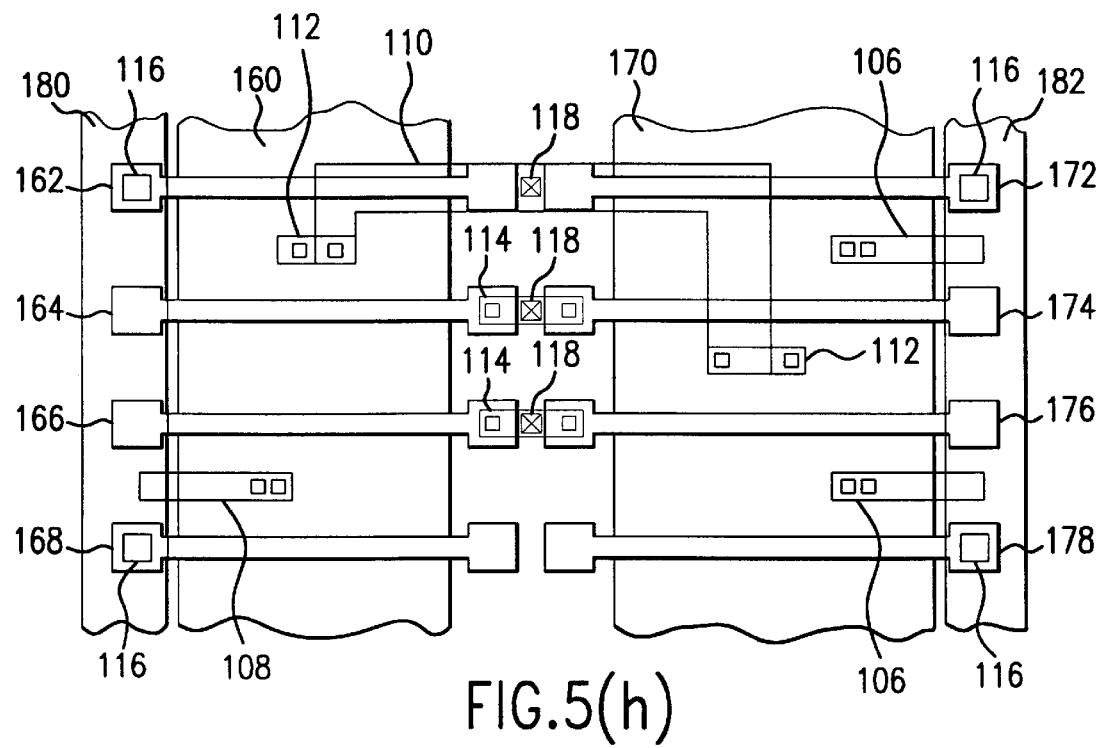

To enable connection between the first metal layer (formed by primitive cells 110 and 112) and the second metal layer (not shown) at the input and output nodes of the circuit, primitive cell 118 is retrieved and positioned over the primitive cell 110, and over both of the primitive cells 114, as shown in FIG. 5h, completing the design.

The configuration of the two input NAND logic circuit is then stored in memory in a circuit cell library. Whenever such a circuit is needed in the IC, that cell is retrieved and positioned on the appropriate portion of the gate array. Other logic circuits may be similarly designed and stored in the circuit cell library.

The primitive cells of the primitive cell library are referenced or called by a logic circuit cell, such as the two input NAND logic circuit cell, in the circuit cell library through software. The cells in the circuit cell library arc referenced by the IC. Any change in a primitive cell in the primitive cell library which is part of a circuit cell will automatically be expressed in the design of the circuit cell in the circuit cell library. Any change in a circuit cell in the circuit cell library which is used in the IC, is similarly automatically expressed in the IC design. Layout software which provides such hierarchical relationships includes VIRTUOSO™, available from Cadence Design Systems, Inc., San Jose, Calif. Such hierarchical structure facilitates transformation, as described further, below.

The example of designing a two input NAND logic circuit with primitive cells in accordance with the present invention described above may be modified by placement of the primitive cells in a different order. A CMOS gate array designed through these primitive cells also has the appearance of the CMOS gate array of FIG. 2.

Figure 6:
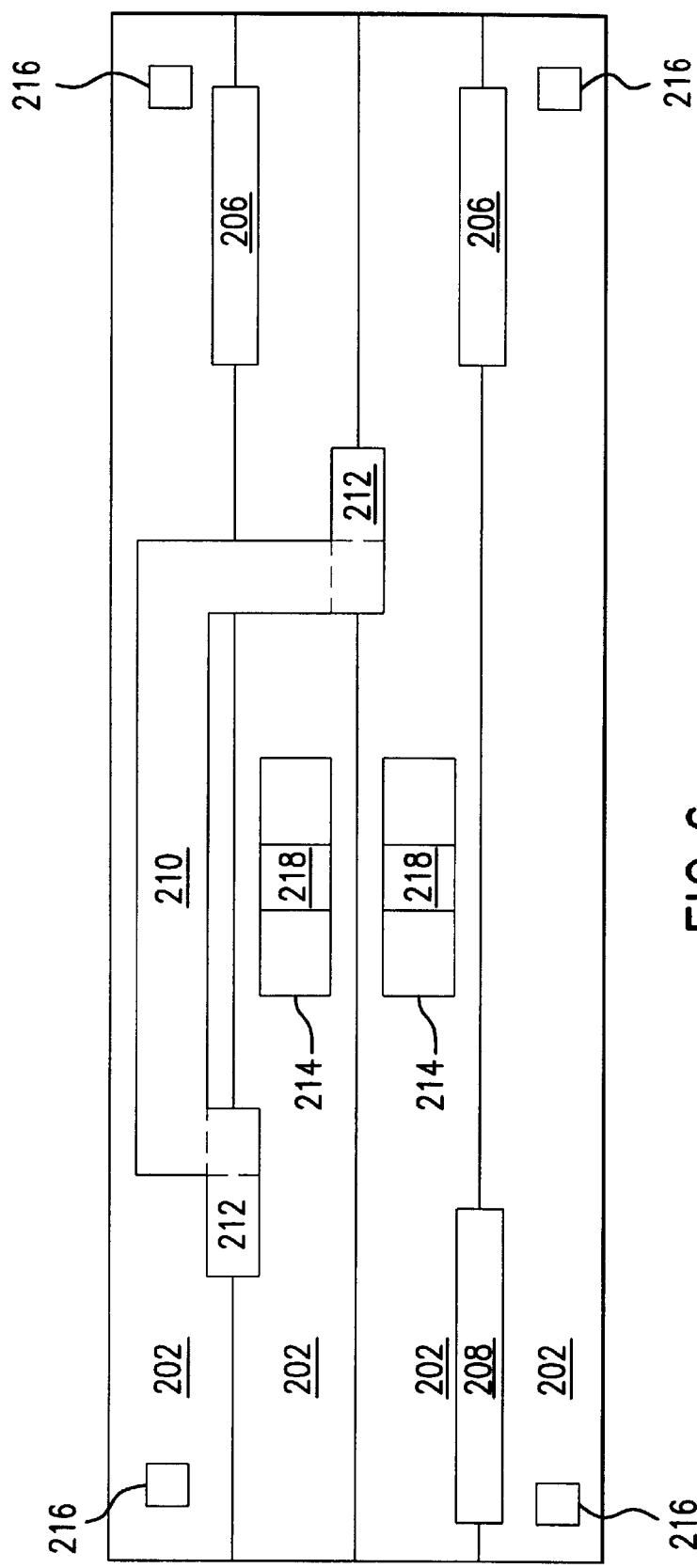
FIG. 6 is a cell outline of a two input NAND logic circuit, indicating the location of the primitive cells defining the logic circuit.
Figure 7A:
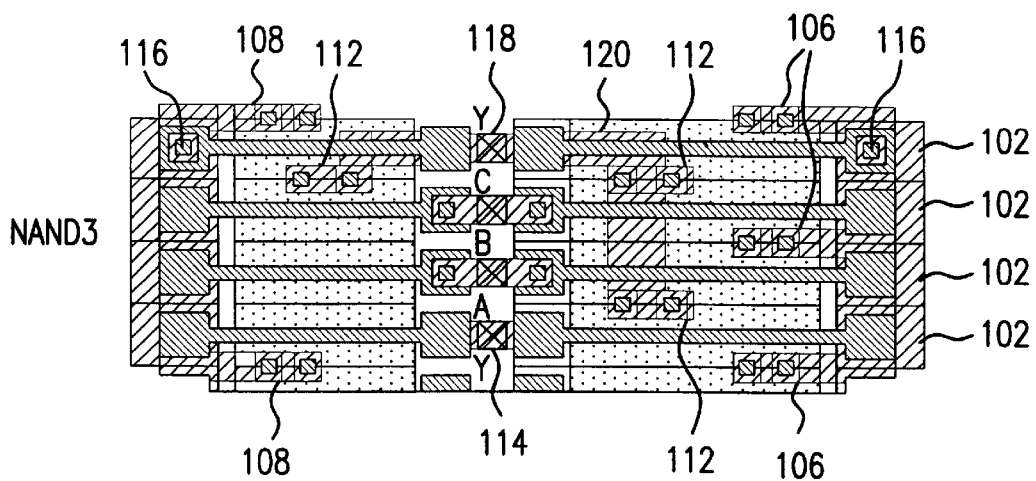
FIGS. 7a–7f show the location of primitive cells on the other logic circuits of the CMOS gate array of FIG. 2.
Figure 7B:
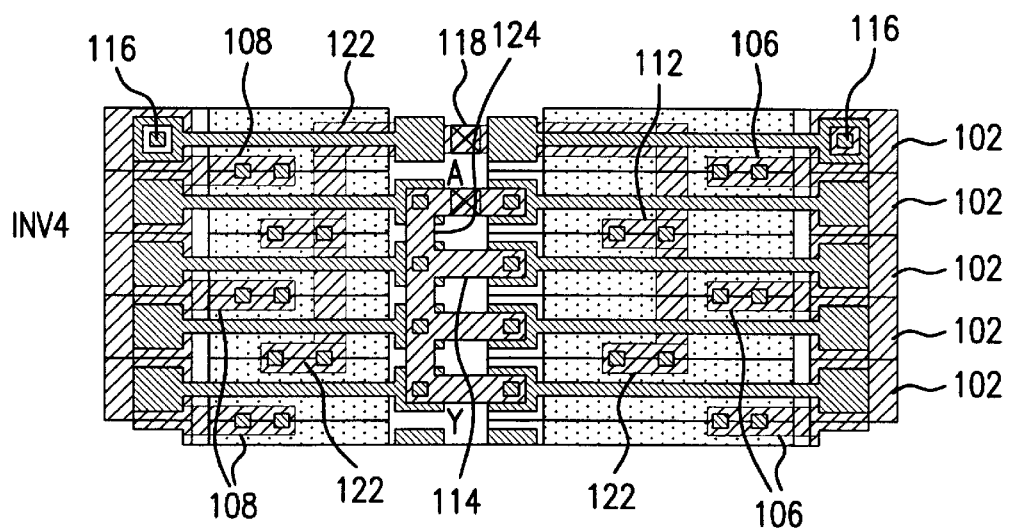
Figure 7C:
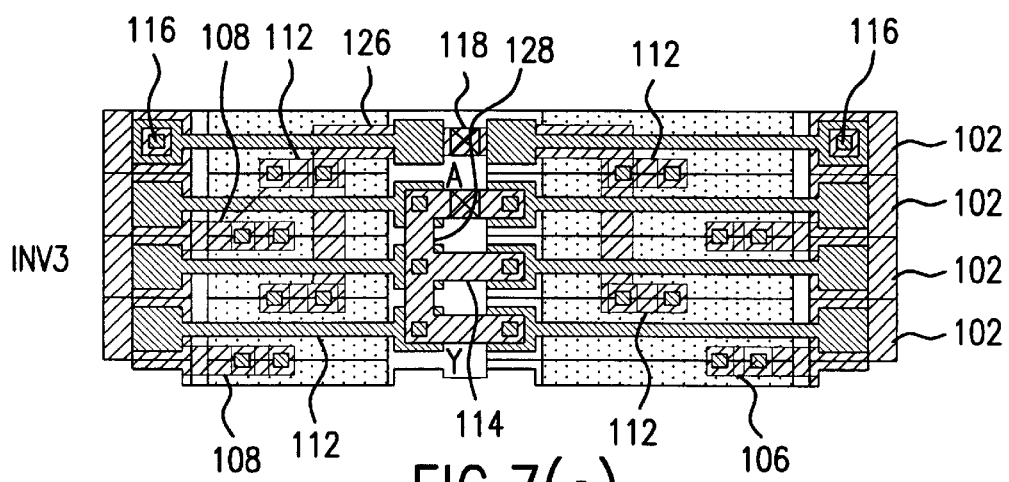
Figure 7D:
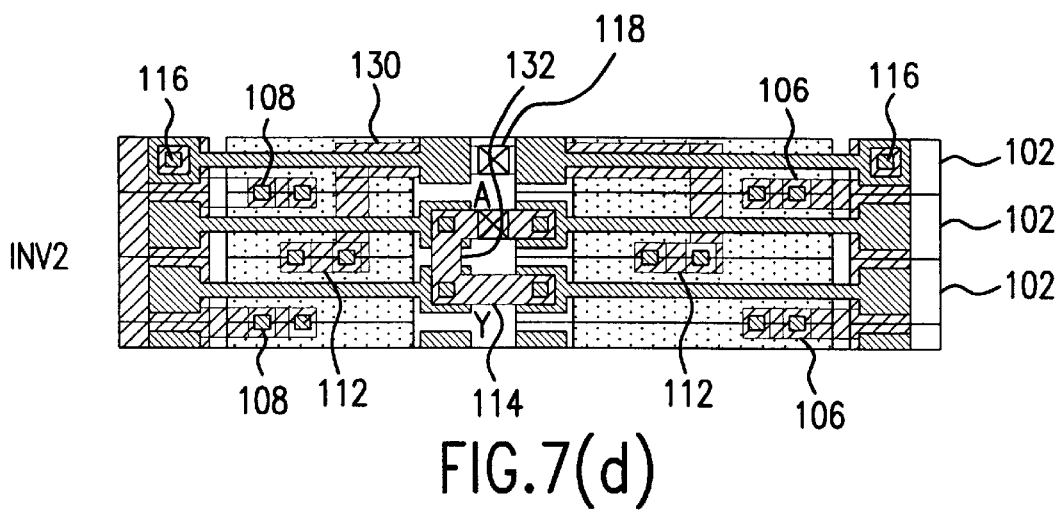
Figure 7E:
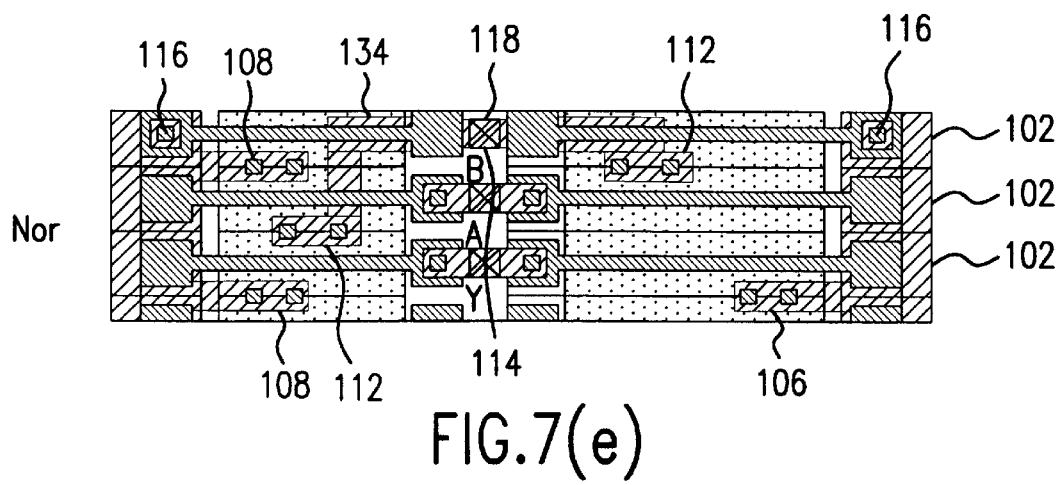
Figure 7F:
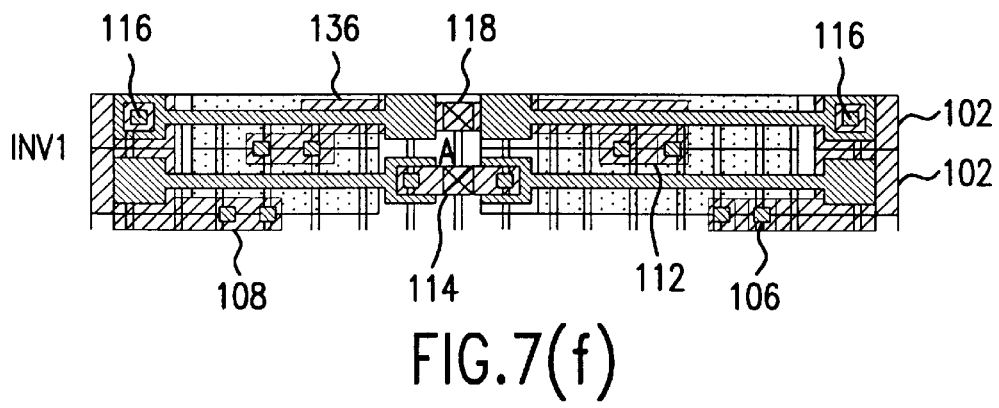

FIG. 6 shows a cell outline box for the two input NAND logic circuit of FIG. 5i, wherein the outline or location of each primitive cell is shown, without showing the contents of each primitive cell. Such cell outlines can be readily prepared through the CAD system after designing the IC with primitive cells. Each of the boxes can be assigned a specific number to identify the type of primitive cell occupying that box, as shown in FIG. 6. Names may be used to identify the primitive cell corresponding to each box on the cell outline, as well. Cell outlines are useful in transforming an IC design for fabrication at another foundry, as described further, below.

Figure 4K:
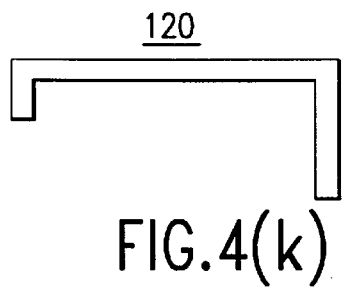
Figure 4L:
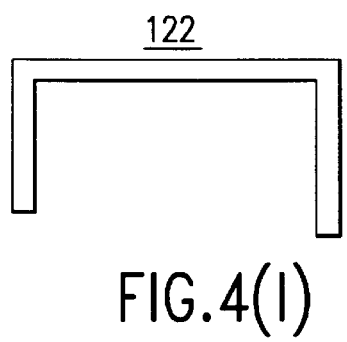
Figure 4M:
Figure 4N:
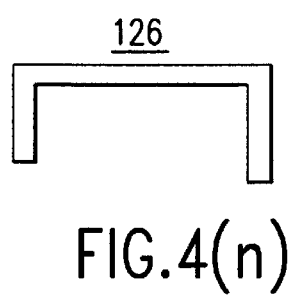
Figure 4O:
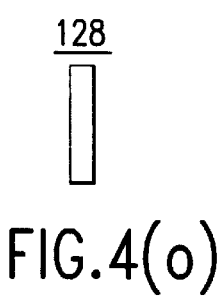
Figure 4P:
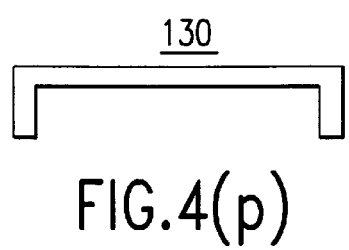
Figure 4Q:
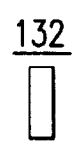
Figure 4R:
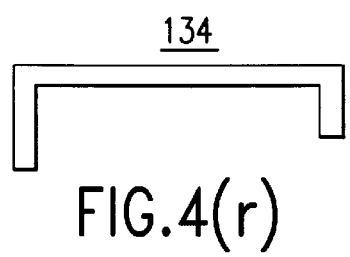
Figure 4S:
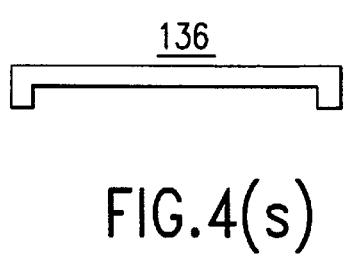

Since each of the primitive cells are defined as minimum functional and geometrical units, the same set of the primitive cells can be used to design other circuits by providing the required functions in that the circuit. FIGS. 7a–7f show the six other logic circuits in FIG. 2 (NAND3, NV4, INV3, INV2, NOR2 and INV1), identifying the primitive cells discussed above. Other circuits may be similarly designed by primitive cells. It may be necessary to provide additional primitive cells to the set of primitive cells discussed above to accommodate other circuits. For example, different primitive cells are required to define the metal layer for connecting the appropriate n and p-channel transistors to implement different logic circuits. In the NAND3 logic circuit in FIG. 7a, for example, a primitive cell 120 (FIG. 4k) is used. In the INV4 gate in FIG. 7b, a primitive cell 122 (FIG. 4l)is used instead of the primitive cell 110 in the two input NAND logic circuit of FIG. 3a. In the INV3 gate in FIG. 7c, the primitive cell 126 (FIG. 4n) is used. In the INV2 gate in FIG. 7d, the primitive cell 130 (FIG. 4p) is used. In the NOR1 gate in FIG. 7e, the primitive cell 134 (FIG. 4r) is used. In the INV1 gate in FIG. 7f, the primitive cell 136 (FIG. 4s) is used. In addition, primitive cells 124 (FIG. 4m), 128 (FIG. 4o) and 132 (FIG. 4q) are required to connect the inner electrodes of the n-channel transistors in the INV4, INV3 and INV2 logic circuits. In each case, the primitive cells are referenced by the circuit cells in the circuit cell library and the circuit cells are referenced by the IC with layout software such as VIRTUOSO™ (discussed above), or other appropriate software for defining hierarchical relationships.

Figure 8:
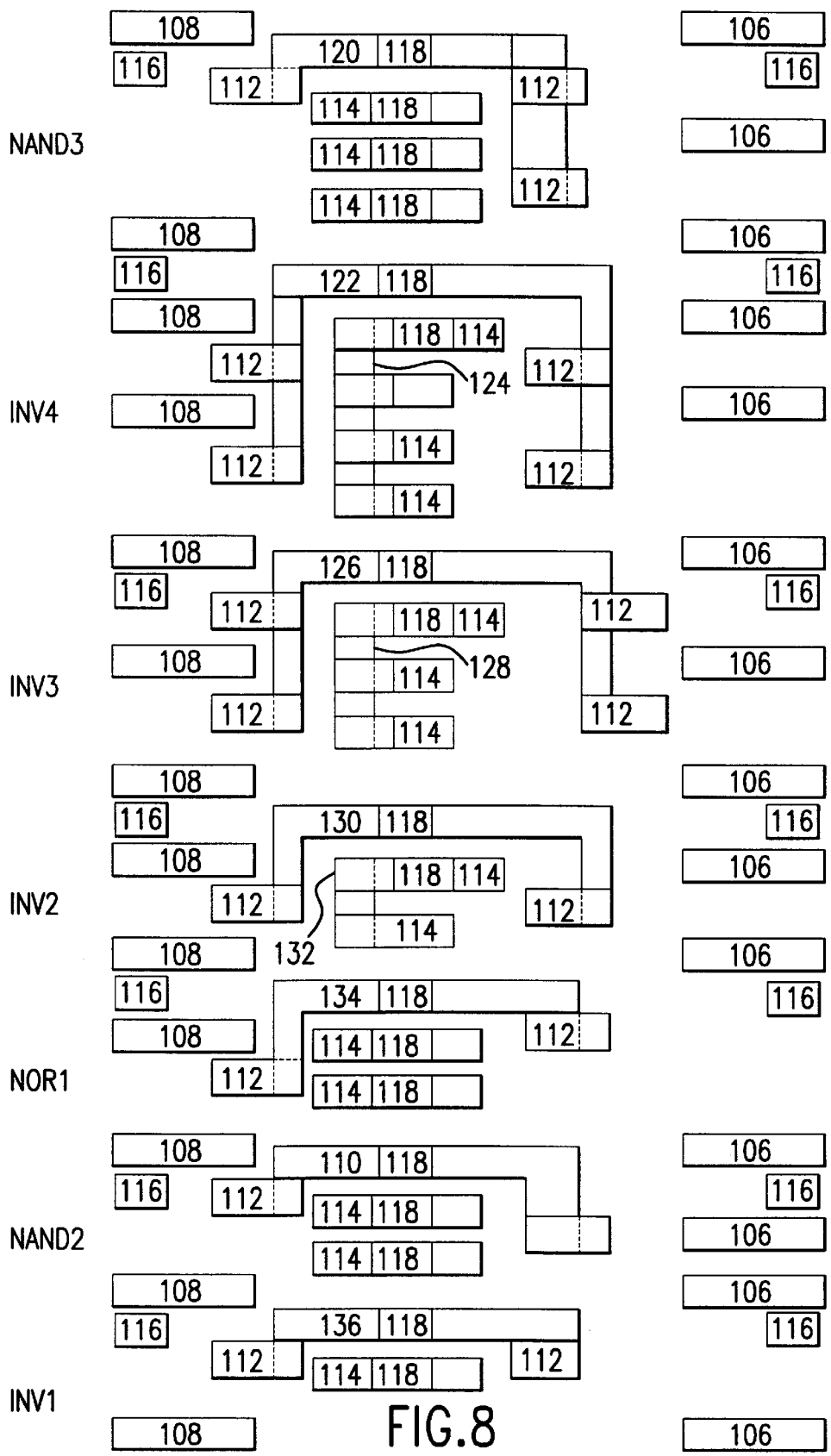
FIG. 8 is a cell outline of the primitive cells defining the CMOS gate array of FIG. 2.

FIG. 8 is a cell outline of the CMOS gate array showing the seven logic gates of FIG. 2, and identifying the positions of the primitive cells required to design the CMOS gate array according to the present invention. It is noted that all primitive cells of the same type are commonly identified in the cell outlines of all the logic circuits of the IC, which facilitates transformation of the design to a different foundry, as described further, below.

The method of the present invention may be applied to the input/output ("I/O") section of the IC, as well. Primitive cells can be designed for the I/O section in an analogous manner as described above.

As discussed above, it is often necessary and/or desirable to convert an IC design developed for one foundry under a first set of design rules to a design for fabrication by another foundry under a different set of design rules. In accordance with the present invention, transformation of an IC design for fabrication under a different set of design rules is facilitated through the use of primitive cells.

In the design of an IC for fabrication in a different foundry, all the functions described above must still be provided. The IC to be fabricated in the new foundry may therefore comprise logic circuits comprising primitive cells in the same manner as described above. However, because the second foundry has different design rules defining, for example, minimum spacing between transistors, minimum separation between conductors, minimum metal width, the size of contacts and the amount of metal around a contact ("metal surround"), certain dimensions of the primitive cells for an IC to be fabricated at a different foundry may differ from the primitive cells of the original IC. New sets of primitive cells are therefore developed meeting the design rules of other foundries. For example, the primitive cells for use in other foundries typically include contacts with different dimensions.

Preferably, not all the dimensions of the primitive cells are transformed. Transformation in accordance with the present invention is facilitated by maintaining the length and width of the metal portions of each particular type of primitive cell, in each set of primitive cells. For example, the respective primitive cells corresponding to primitive cells 102, 104, 106, 108, 112, 114, 138 and 140 (FIG. 4) for use in foundries with different design rules, preferably have the same length and width as those primitive cells. If primitive cells 116 and 118 are used instead of primitive cells 138 and 140, the length and width of the metal surrounding the primitive cells 116 and 118, and corresponding metal surrounding those primitive cells for use in other foundries, is also preferably the same, while the size of the contacts themselves may differ. By maintaining the length and width of each primitive cell the same when transforming the IC design for fabrication at a different foundry, the primitive cells for the original foundry may be replaced by the primitive cells for the new foundry, without changing the relative positions of the primitive cells in a circuit cell or in the IC design, as discussed further, below.

Prior to transformation, it is therefore necessary to define a set of primitive cells conforming to the design rules of the new foundry. To maintain the dimensions of the outer boundaries of the primitive cells the same in the new set of primitive cells, the length and width of the primitive cell is chosen to accommodate the largest dimensions required by any of the foundries where the IC is or may be manufactured. For example, the IC may be designed for fabrication at a foundry which requires contact dimensions of 1.2×1.2 microns, contact spacing of 1.0 microns and a metal surround of 0.1 microns. However, it may also be desirable or necessary to fabricate the IC at a foundry requiring contact dimensions of 0.6×0.6 microns, contact spacing of 0.6 microns, and metal surround of 0.6 microns. Therefore, to satisfy the requirements of both foundries without having to change the length and width of the primitive cell 140, the outer dimensions of the single contact primitive cells 138, 140 and all primitive cells corresponding to primitive cell 138, 140, is preferably 1.8×1.8 microns. For a two contact primitive cell, such as primitive cell 112 in FIG. 4g, the dimensions arc preferably 3.8×1.8 microns.

As discussed above, prior to transformation, a new primitive cell library is required conforming to at least the minimum requirements of the design rules of the new foundry. When converting a CMOS gate array design from one foundry to another foundry with a different set of design rules, the dimensions of the IC is preferably held constant. While the size of certain components of the circuit, such as the contacts and the gate length, may change, the distance between the centerlines of the gates is maintained. Since the distance between the centerlines of adjacent gates and the size of the IC is not changed, the metal interconnection between drains of the n and p-channel transistors layer need not be changed. As discussed above, the length and width of corresponding primitive cells preferably stays the same.

Figure 9A:
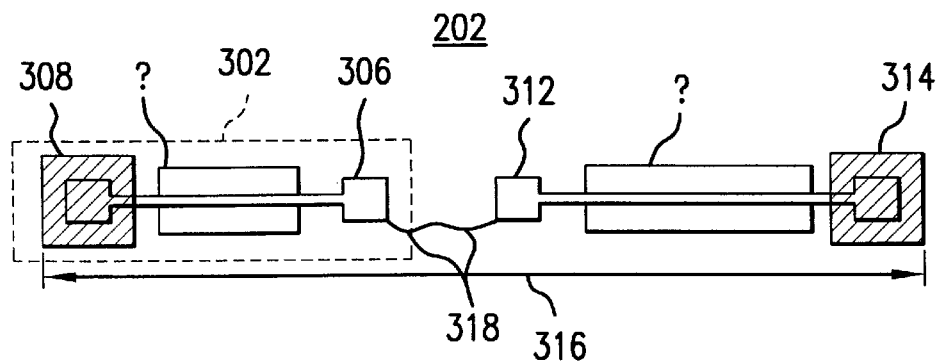
FIGS. 9a–9g show primitive cells designed for fabrication of an IC under a different set of design rules.

FIG. 9a shows a primitive cell 202 which corresponds to the primitive cell 102 in FIG. 4a. The length of the gate electrodes 306, 312 of the primitive cell 202 is reduced as compared to the length of the gate electrodes 6, 12 of the cell 102 in FIG. 4a, while the width 16, 316 of the cells 102, 202 in X-direction are the same. The sizes of the metals 308, 314, 8, 14 and the active areas 304, 310, 4, 10 are also the same in both cells. The primitive cell 202, and the remaining primitive cells for the new foundry, are designed in a similar manner as described above with respect to primitive cell 102, layer by layer as necessary, in accordance with the design rules for that foundry.

Figure 9B:
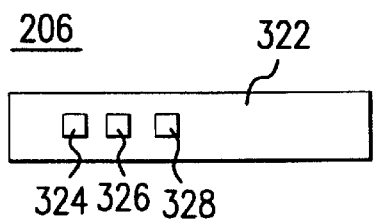
Figure 9C:
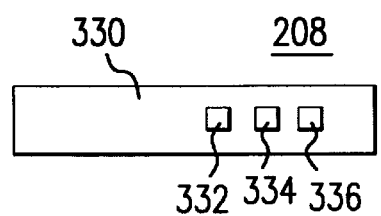
Figure 9D:
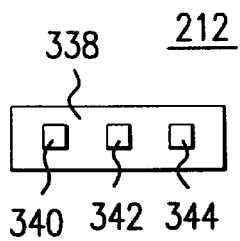
Figure 9E:
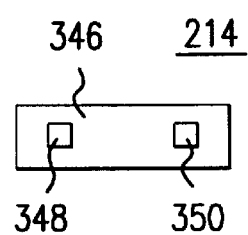
Figure 9F:
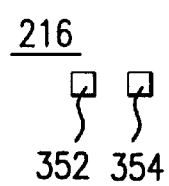
Figure 9G:
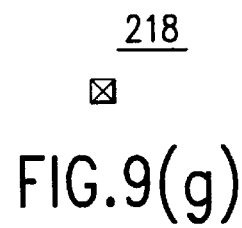

FIG. 9b shows a primitive cell 206 which corresponds the primitive cell 106 in FIG. 4b in accordance with the design rules of the second foundry. The size of the contacts and the dimensions of the metal strip in the second foundry is smaller than that in the first foundry. Primitive cell 106 may consist of two 1.2×1.2 micron contacts with spacing of 1.0 microns and metal surround of 0.1 microns. The second foundry design rules may require that the corresponding primitive cell 206 consist of 0.6×0.6 microns, contact spacing of 0.6 microns and metal surround of 1.8 microns. As discussed above, while the size and number of the contacts 24, 26, 324, 326, 328 will vary, the length and width of the primitive cells 106 and 206 are preferably the same. In accordance with these design rules, the widths of the primitive cells 106 and 206 are at least 1.8 microns.

The primitive cell designed under the new set of design rules may have differences in other characteristics besides those required by the new set of design rates. For example, because the contacts 324, 326, 328 in accordance with the second foundry's design rules must be smaller than the contacts 24, 26 fabricated in the first foundry, it is preferred to provide three contacts 324, 326, 328 instead of two, for improved reliability. The second foundry's design rules do not prescribe the number of contacts, only their size and spacing. The present invention enables the simple addition of circuit components, such as contacts, when necessary upon transformation of a design for fabrication under a new set of design rules. Other components whose numbers or sizes may be increased for improved reliability, or for other reasons such as improved performance (speed, power dissipation) and manufacturability, include the size of the ends of the electrodes ("heads") to accommodate additional contacts, the transistor length and width, and the size of the metal interconnections.

In designing the primitive cell 206 with the CAD system, separate layers for the metal strip 322 and contacts 324, 326, 328 are needed to complete the cell, one for the metal strip and another for the contacts. Primitive cell 108 in FIG. 4b may be similarly converted into a primitive cell 208 as shown in FIG. 9b.

Since the overall dimensions of the IC in this example are not changed, it is not necessary to transform the primitive cell 110 in FIG. 4f and the primitive cell 110 may therefore be used in IC's fabricated in the new foundry. If necessary or desired, however, primitive cells corresponding to such metallization layers can also be redesigned for a new foundry. Similarly, each of the primitive cells 208, 212, 214, 216, 218 in FIGS. 9a–9g corresponds to the primitive cells 108, 112, 114, 116, 118 in FIG. 4, respectively, in accordance with the design rules of the second foundry.

The second set of primitive cells are stored in a second library in memory, as well. Corresponding primitive cells in the first and second primitive cell libraries are preferably identified by the same number or name.

After the set of primitive cells for the second foundry are designed, a first IC design may be readily transformed to an IC design for fabrication by the second foundry.

As discussed above, during the design of each logic circuit, the configuration of the primitive cells are referenced by the logic circuit design stored in the cell library through software, such that a change in the configuration of a primitive cell automatically changes the configuration of the logic circuit cells incorporating that primitive cell. Similarly, during design of the IC, the logic circuits making up the IC are referenced to the logic circuit cells stored in the cell library through the software such that a change in a circuit cell in the circuit cell library automatically changes the corresponding logic circuit in the IC. Such a hierarchical structure enables the simple, automatic transformation of the IC design for fabrication at a foundry under a different set of design rules by simply changing the reference from the circuit cell library to a new primitive cell library corresponding to the new set of design rules. Since the length and width of the primitive cells are not changed, the primitive cells for the new foundry may replace the original primitive cells, without changing the relative positions of the primitive cells in the ID logic circuit cells and on the IC and without changing the metallization layer.

In an alternative transformation method, the primitive cells in the original IC design are replaced by primitive cells for the new foundry, by primitive cell type. The cell outline of FIG. 7 identifies the location of each primitive cell by a specific number or name for that particular type of primitive cell. Each type of primitive cell may be repeated thousands to millions of times in a typical IC design. The designer may select or "find" one of the primitive cells, i.e., cell 102 in FIG. 4a, for example, in the first IC design. The CAD system then identifies every place that the cell 102 is located. Using the appropriate command of the CAD system, such as an "edit-in-place" command, the designer then replaces all occurrences of the cell 102 with the corresponding cell 202 from the second set of the primitive cells. The use of the "edit-in-place" function, or other similar functions of CAD systems, is well known in the art. The designer may repeat this procedure for the rest of the primitive cells on the IC design until all of the first set of the primitive cells are replaced with the second set of the primitive cells, completing the transformation.

Figure 10:
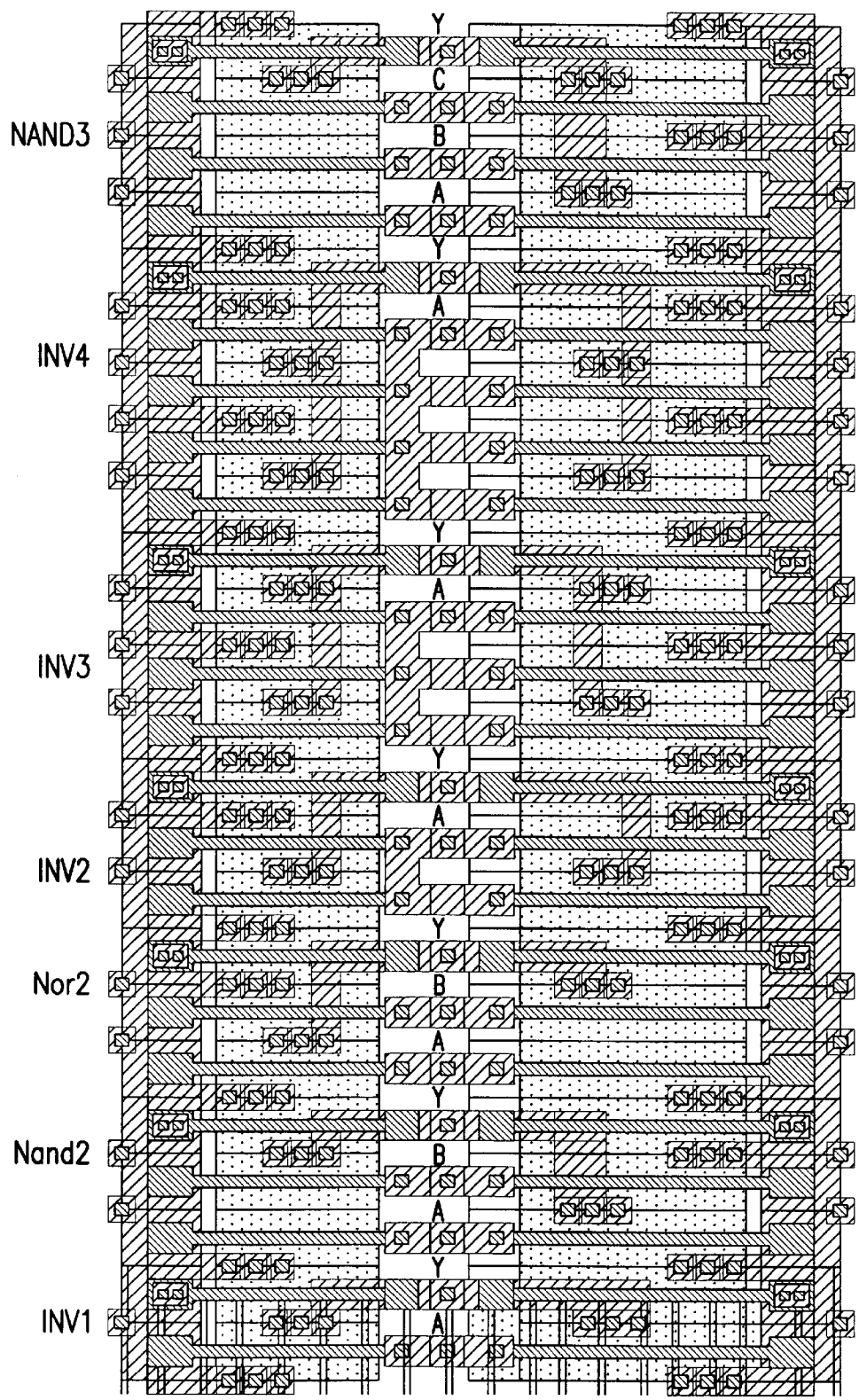
FIG. 10 shows a CMOS gate array having a transformed design for fabrication under a different set of design rules.

FIG. 10 shows the layout of the CMOS gate array 300 corresponding to the CMOS gate array in FIG. 2, after the transformation of the design using the method of the present invention. The two designs are substantially the same except that the design rules of the gate array in FIG. 10 meets a different set of design rules than the gate array in FIG. 2.

By the method of the present invention, complex IC designs may thereby be readily transformed between foundries by creating a small set of primitive cells for each foundry and building the IC from the primitive cells. Only about eight to twenty primitive cells may be required. In contrast, to transform an IC design on a cell by cell basis, as in the prior art, each of the several hundred cells in the cell library needs to be individually created for a new set of design rules.

The I/O section of the IC can also be transformed for fabrication under a different set of design rules, in a similar manner.

After transformation, the new IC design is simulated to verify its performance. New cell delays are calculated with HSPICE®, available for AVANT!, Sunnydale, Calif., as is known in the art.

The power dissipation of the transistors of the IC may not meet requirements after transformation. The IC may then need to be further redesigned to meet requirements, as is known in the art. Power dissipation may be adjusted as described in U.S. Patent Application entitled "Parameter Adjustment in a MOS Integrated Circuit", U.S. Ser. No. 09/376,246, filed on Aug. 18, 1999, assigned to the assignee of the present invention and incorporated by reference, herein.

After verification of the transformed design, a new set of masks for fabricating the IC is created in a conventional manner.

Although it is not explicitly described, it is apparent that the method of the present invention could be applied equally to the transformation from the smaller design rules to the larger design rules.

The present invention is also equally applicable to standard cell design. It is also applicable to reductions in scale in both the X and Y dimensions. In standard cell design, for example, the size of the IC may not maintained along either axis. In such a case, in addition to the primitive cells redesigned for use in a different foundry discussed above, primitive cells for the metallization layers may also be redesigned for fabrication in a different foundry.

While the present invention has been described with reference to the presently preferred embodiments, it will be apparent to those skilled in the art that various changes and modifications may be made without departing from the spirit and scope of the invention, as defined by the claims below.

What is claimed is:

1. A method of transforming an integrated circuit design for fabrication with different design rules using a computer aided design system, the method comprising;
    defining a first set of logic circuit sub-components, which includes a plurality of logic circuit sub-components, each of the logic circuit sub-components being a functional and geometrical element of a logic circuit design, wherein the integrated circuit design is created from a plurality of logic circuit designs which include logic circuit sub-components selected from the first set of logic circuit sub-components, the sub-components conforming to a first set of design rules;
    defining a second set of logic circuit sub-components, which includes a plurality of logic circuit sub-components, each logic circuit sub-component of the second set of logic circuit sub-components corresponding to a respective one of the logic circuit sub-components of the first set of logic circuit sub-components, the second set of logic circuit sub-components conforming to a second set of design rules different from the first set of design rules; and
    replacing occurrences of each of the first set of logic circuit sub-components with the second set of logic circuit sub-components in the integrated circuit design, thereby transforming the integrated circuit design to a design conforming to the second set of design rules, wherein the length and width of the corresponding logic circuit sub-components in the first and second sets of logic circuit sub-components are the same.

2. The method of claim 1, further comprising creating a first circuit cell library, wherein the first circuit cell library comprises logic circuit designs, and wherein the logic circuit designs comprise logic circuit sub-components selected from the first set of logic circuit sub-components.

3. The method of claim 2, further comprising creating a second circuit cell library, wherein the second circuit cell library comprises logic circuit designs, and wherein the logic circuit designs comprise logic circuit sub-components selected from the second set of logic circuit sub-components.

4. The method of claim 3, further comprising relating the first set of logic circuit sub-components to logic circuit designs for the first circuit cell library through software, such that a change in the design of a logic circuit sub-component in the first set of logic circuit sub-components, automatically changes the designs of logic circuit cells including said logic circuit sub-component in the first circuit cell library.

5. The method of claim 4, wherein creating a second circuit cell library includes replacing the first set of logic circuit sub-components by the second set of logic circuit sub-components.

6. The method of claim 5, further comprising relating the logic circuit designs of the first circuit cell library to the logic circuit designs of the integrated circuit design through software, such that a change in the design of a circuit cell in the first circuit cell library automatically changes said logic circuit designs in the integrated circuit design.

7. The method of claim 6, further comprising automatically replacing circuit cells of the integrated circuit design logic circuit designs of the second circuit cell library.

8. The method of claim 7, wherein the internal configurations of corresponding logic circuit sub-components are different.

9. The method of claim 8, wherein the number of contacts in corresponding logic circuit sub-components is different.

10. The method of claim 5, further comprising identifying corresponding logic circuit sub-components in the first and second set with identifiers which are the same identifiers.

11. A method of transforming an integrated circuit design built from a plurality of first logic circuit sub-components made in accordance with a first set of design rules and comprising a plurality of logic circuit sub-component types for fabrication of the integrated circuit design under a second set of design rules, with a computer aided design system, the method comprising:
    identifying locations of each type of first logic circuit sub-component in the integrated circuit design;
    simultaneously replacing all occurrences of each type of first logic circuit sub-component in the integrated circuit design by a corresponding type of a second logic circuit sub-component designed in accordance with the second set of design rules.

12. The method of claim 11, wherein the identifying step comprises identifying all the locations of each type of first logic circuit sub-component by a common designation through the computer aided design system;
    the method further comprising searching for the common designation to identify the locations of each type of first logic circuit sub-component.

13. The method of claim 12, wherein the identifying step further comprises:
    identifying the occurrences of a plurality of first logic circuit sub-components; and
    replacing all the occurrences of each of the first logic circuit sub-components by a corresponding logic circuit sub-component designed in accordance with the second set of design rules, respectively.

14. The method of claim 13, wherein the identifying step further comprises identifying the locations of each of the plurality of sub-components by a common designation.

15. The method of claim 14, further comprising finding all occurrences of each logic circuit sub-component by searching for the designation for each logic circuit sub-component through software and replacing all occurrences of each logic circuit sub-component through software.

16. A method of transforming an integrated circuit design created for fabrication under a first set of design rules for fabrication under a different set of design rules, with a computer aided design system, the method comprising:

dividing types of logic circuits in the integrated circuit design into sub-components having functions common to a plurality of logic circuits of the integrated circuit design;

designing each sub-component in accordance with the new set of design rules; and simultaneously replacing original sub-components by a new design for each of the sub-components.

17. A library of designs for use in designing an integrated circuit, the library comprising:

a plurality of designs of logic circuit sub-components stored in a memory for defining physical interconnections of a logic circuit, the sub-components being common to a plurality of types of logic circuits, wherein said plurality of designs comprises:

a design of a sub-component for connecting an active area of a generic layer to a power source metal strip;

a design of a sub-component for connecting an active area of the generic layer to a ground metal strip;

a design of a sub-component for connecting an active area of the generic layer to a personalization metal layer;

a design of a sub-component for connecting a gate electrode to either the ground metal or the power source metal strip;

a design of a sub-component for connecting a metal layer to another metal layer; and a design of a sub-component for connecting vertically aligned gate electrodes to each other.

18. The library of claim 17, wherein certain sub-components are for being placed over other sub-components during design of an integrated circuit.

19. A method of designing a library of sub-components of logic circuits for use in a design of an integrated circuit including a personalization layer, comprising;

identifying required functions common to a plurality of logic circuits; and designing a sub-component for implementing the functions in accordance with a first set of design rules, the sub-component including the personalization layer.

20. The method of claim 19, comprising identifying required physical interconnections within a logic circuit and designing a sub-component for implementing the interconnections.

21. The method of claim 19, wherein the sub-component for implementing a connection is for being placed over a sub-component for implementing a function during design of the integrated circuit.

22. The method of claim 21, further comprising designing each of the sub-components in accordance with a second set of design rules.

23. The method of claim 22, wherein certain of the sub-components designed in accordance with the second set of design rules have different characteristics than the corresponding sub-component designed under the first set of design rules, in addition to differences required by the second set of design rules.

24. The method of claim 22, comprising storing the design in memory chosen from a group consisting of a disk and a hard-drive of a computer.

25. The method of claim 19, further comprising designing the sub-component in accordance with a second set of design rules.

26. The method of claim 19, further comprising storing the design in memory.

27. A method of designing a portable integrated circuit including a personalization layer using a computer aided design system, comprising:

defining a set of sub-components of a logic circuit, each of the sub-components being a functional and geometrical element of the logic circuit, the sub-components being common to a plurality of logic circuits of the integrated circuit and including the personalization layer; and individually positioning the sub-components on a computer screen to create a design for the integrated circuit.

28. The method of claim 27, comprising defining a set of sub-components for providing physical interconnections within a logic circuit.

* * * * *